(12) United States Patent
Ukeda

(10) Patent No.: US 8,368,063 B2
(45) Date of Patent: Feb. 5, 2013

(54) ORGANIC SEMICONDUCTOR DEVICE AND MANUFACTURING METHOD THEREOF

(75) Inventor: Takaaki Ukeda, Osaka (JP)

(73) Assignee: Panasonic Corporation, Osaka (JP)

(*) Notice: Subject to any disclaimer, the term of this patent is extended or adjusted under 35 U.S.C. 154(b) by 17 days.

(21) Appl. No.: 13/086,485

(22) Filed: Apr. 14, 2011

(65) Prior Publication Data

US 2011/0248248 A1    Oct. 13, 2011

Related U.S. Application Data

(63) Continuation of application No. PCT/JP2010/002658, filed on Apr. 13, 2010.

(51) Int. Cl.
*H01L 29/08*    (2006.01)
(52) U.S. Cl. ............................................ 257/40; 438/82
(58) Field of Classification Search .................... 257/40; 438/82
See application file for complete search history.

(56) References Cited

U.S. PATENT DOCUMENTS

| | | | |
|---|---|---|---|
| 5,847,413 | A | 12/1998 | Yamazaki et al. |
| 7,250,629 | B2 | 7/2007 | Koo et al. |
| 2005/0211975 | A1 | 9/2005 | Kawasaki et al. |
| 2007/0012916 | A1 | 1/2007 | Choi et al. |
| 2007/0212807 | A1 | 9/2007 | Yamada et al. |
| 2007/0254429 | A1 | 11/2007 | Cho et al. |
| 2009/0272966 | A1 | 11/2009 | Yamaga et al. |

FOREIGN PATENT DOCUMENTS

| | | |
|---|---|---|
| JP | 08-160469 | 6/1996 |
| JP | 2005-277238 | 10/2005 |
| JP | 2006-049833 | 2/2006 |
| JP | 2007-027733 | 2/2007 |
| JP | 2007-273957 | 10/2007 |
| JP | 2007-300116 | 11/2007 |
| JP | 2008-041889 | 2/2008 |
| JP | 2008-288313 | 11/2008 |

OTHER PUBLICATIONS

International Search Report and Written Opinion in PCT/JP2010/002658, mailing date of May 18, 2010.

*Primary Examiner* — Douglas Menz
(74) *Attorney, Agent, or Firm* — Greenblum & Bernstein, P.L.C.

(57) ABSTRACT

An organic semiconductor device includes a gate electrode above a substrate. A gate insulation film is over the gate electrode. A first electrode is above the gate insulation film. A second electrode is above the gate insulation film. The second electrode is annular and surrounds the first electrode. An organic semiconductor layer is above the gate insulation film and over the first electrode. The second electrode surrounds the organic semiconductor layer and defines an outer periphery of the organic semiconductor layer. A conductive guiding member is above the gate insulation film. The conductive guiding member is annular and surrounds the second electrode. A protective film is above the gate insulation film and over the organic semiconductor layer and the second electrode. The conductive guiding member surrounds the protective film and defines an outer periphery of the protective film.

20 Claims, 17 Drawing Sheets

PRIOR ART

ORGANIC SEMICONDUCTOR DEVICE AND MANUFACTURING METHOD THEREOF

CROSS REFERENCE TO RELATED APPLICATION

This is a continuation application of PCT Application No. PCT/JP2010/002658, filed on Apr. 13, 2010, designating the United States of America, the disclosure of which, including the specification, drawings and claims, is incorporated herein by reference in its entirety.

BACKGROUND OF THE INVENTION

1. Field of the Invention

The present invention relates to an organic semiconductor device such as an organic thin-film transistor, and a manufacturing method thereof.

2. Description of the Related Art

Typical active-matrix flat-panel displays (FPD), such as a liquid crystal display and an organic electroluminescence (EL) display, have employed switching elements referred to as thin-film transistors (TFT) in order to drive pixels.

Organic thin-film transistors are attracting attention in recent years as such switching elements used for driving pixels in electronic paper and next-generation FPDs. Hence, various organic thin-film transistors have been introduced (Patent Reference 1: Japanese Unexamined Patent Application Publication No. 2007-273957, for example).

Described below is a conventional organic thin-film transistor disclosed in Patent Reference 1, with reference to FIGS. 13A and 13B. FIG. 13A is a plan view of the conventional organic thin-film transistor having a drain electrode, a source electrode, and a gate electrode. FIG. 13B is a cross-sectional view of the conventional organic thin-film transistor taken from line G-G' of FIG. 13A.

As shown in FIGS. 13A and 13B, a conventional organic thin-film transistor 101 includes the following: a substrate 111, a ring-like gate electrode gate electrode 112, a ring-like drain electrode 114 formed above the gate insulation film 113, and a ring-like source electrode 115 formed above the gate insulation film 113 and around the drain electrode 114.

The conventional organic thin-film transistor 101 has an organic semiconductor layer 117 (i) formed above a region including the drain electrode 114 and the source electrode 115, and (ii) fill a space between the drain electrode 114 and the source electrode 115. In order to have the organic semiconductor layer 117 formed a solution including an organic semiconductor material is applied over the drain electrode 114.

Moreover, the conventional organic thin-film transistor 101 has a passivation film 120 formed over the organic semiconductor layer 117 in order to inhibit deterioration of the organic semiconductor layer 117 caused by water and oxygen in the air.

Regarding the conventional organic thin-film transistor 101, however, the passivation film 120 formed over the organic semiconductor layer 117 covers the entire organic thin-film transistor 101. Thus, the passivation film 120 is not suitable enough as a protective film dedicated to the organic semiconductor layer 117.

Hence, the conventional organic thin-film transistor 101 has a problem in that the passivation film 120 cannot prevent water and oxygen from entering the organic semiconductor layer 117, resulting in deterioration of the organic semiconductor layer 117 and variations in threshold voltage "Vt".

The present invention is conceived in view of the above problem and has as an object to introduce an organic semiconductor device and a manufacturing method thereof which can provide effective protection for an organic semiconductor layer to prevent deterioration of the organic semiconductor layer.

SUMMARY OF THE INVENTION

In order to solve the above problem, an organic semiconductor device according to an aspect of the present invention includes: a substrate; a gate electrode which is formed above the substrate; a gate insulation film which is formed on the gate electrode; a first electrode which is formed above the gate insulation film and is one of a source electrode and a drain electrode; a second electrode which (i) is formed above the gate insulation film and shaped in a loop so as to surround the first electrode, and (ii) works as an other one of the source electrode and the drain electrode; an organic semiconductor layer which is formed above the gate insulation film and applied to a region surrounded by the looped second electrode so as to cover the first electrode, the looped second electrode defining an outer periphery of the organic semiconductor layer; a conductive guiding member which is shaped in a loop and formed above the gate insulation film outside the looped second electrode; and a protective film which (i) is applied to a region surrounded by the looped conductive guiding member so as to cover the organic semiconductor layer, and (ii) protects the organic semiconductor layer, the looped conductive guiding member defining an outer periphery of the protective film.

An organic semiconductor device according to an implementation of the present invention employs a protective film to inhibit water, oxygen, and impurities from entering an organic semiconductor layer. This structure makes possible preventing deterioration of the organic semiconductor layer. Accordingly, the prevention of deterioration contributes to fewer threshold voltage variations observed in the organic semiconductor device introduced above.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Figure 1A:
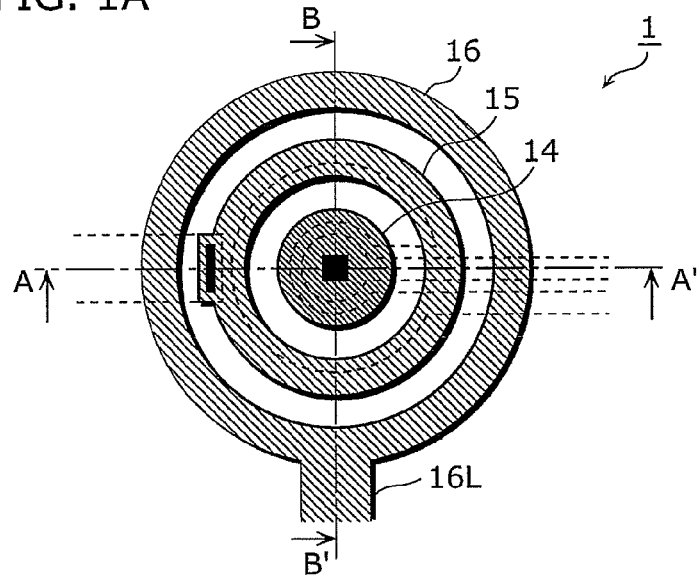
FIG. 1A is a plan view of an organic semiconductor device according to Embodiment 1 of the present invention, the organic semiconductor device which has a drain electrode, a source electrode, and a conductive guiding member.

An organic semiconductor device according to an aspect of the present invention includes: a substrate; a gate electrode which is formed above said substrate; a gate insulation film which is formed on the gate electrode; a first electrode which is formed above the gate insulation film and is one of a source electrode and a drain electrode; a second electrode which (i) is formed above the gate insulation film and shaped in a loop so as to surround the first electrode, and (ii) works as an other one of the source electrode and the drain electrode; an organic semiconductor layer which is formed above the gate insulation film and applied to a region surrounded by the looped second electrode so as to cover the first electrode, the looped second electrode defining an outer periphery of the organic semiconductor layer; a conductive guiding member which is shaped in a loop and formed above the gate insulation film outside the looped second electrode; and a protective film which (i) is applied to a region surrounded by the looped conductive guiding member so as to cover the organic semiconductor layer, and (ii) protects the organic semiconductor layer, the looped conductive guiding member defining an outer periphery of the protective film.

This structure allows the protective film to inhibit water, oxygen, and impurities from entering the organic semiconductor layer, and thus prevents the organic semiconductor layer from deteriorating. In addition, the conductive guiding member defines the outer periphery of the protective film. Such defining prevents the protective film from interfering with interlayer wiring connection.

Preferably, the organic semiconductor device according to the aspect of the present invention further includes an interlayer insulation film which is formed on the protective film.

According to the structure, the protective film can prevent the organic semiconductor layer from characteristically degrading, and the interlayer insulation film can prevent an interlayer current leakage.

In the organic semiconductor device according to the aspect of the present invention, preferably, the looped second electrode is a source electrode shaped in a loop, and the looped conductive guiding member has a voltage applied, the voltage being as great in electric potential as a voltage applied to the looped source electrode.

This structure prevents a potential difference from occurring between the source electrode and the conductive guiding member. Accordingly, the structure prevents a micro current between the source electrode and the conductive guiding member from occurring to reduce an increase in the off-current.

In the organic semiconductor device according to the aspect of the present invention, preferably, a voltage of zero volts is applied to (i) the looped conductive guiding member, and (ii) the looped source electrode.

The above structure can nearly prevent an effect caused by the interaction occurring between the organic semiconductor devices.

In the organic semiconductor device according to the aspect of the present invention, preferably, the protective film includes a high polymer material and a low polymer material which are photoinitiator-crosslinking. In the organic semiconductor device according to the aspect of the present invention, preferably, the protective film includes a high polymer material and a low polymer material which are both photoinitiator-crosslinking and thermal crosslinking.

Since the structure employs a photoinitiator crosslinking material as a material of the protective film, the molecular structure of the protective film becomes denser, and thus the polymer binding becomes more solid. Such solid polymer binding can effectively block water, oxygen, and impurities which would enter the organic semiconductor layer.

In the organic semiconductor device according to the aspect of the present invention, preferably, the looped second electrode is (i) centered coincident with said first electrode, and (ii) shaped in an unbroken single loop This structure makes possible maintaining distance constant between the first electrode and the second electrode. Thus, an electric field between the first electrode and the second electrode can be equal. Furthermore, the looped second electrode is in an unbroken single shape. Hence, the looped second electrode surrounds the region to define the organic semiconductor layer applied to the region. Accordingly, the organic semiconductor layer cannot leak from the region.

In the organic semiconductor device according to the aspect of the present invention, preferably, the looped second electrode is in a ring-like shape. In the organic semiconductor device according to the aspect of the present invention, preferably, the looped conductive guiding member is in a ring-like shape.

This structure allows each of the electrodes to be formed concentrically and electric fields to be equally distributed. In addition, the concentrically formed electrodes allow a solution, including a material of the organic semiconductor layer or the protective film, to spread concentrically when the solution is applied. This structure makes possible forming an organic semiconductor layer or a protective film with significant uniformity without uneven film-thickness.

In the organic semiconductor device according to the aspect of the present invention, preferably, the looped second electrode is in a rectangle shape. In the organic semiconductor device according to the aspect of the present invention, preferably, the looped conductive guiding member is in a rectangle shape.

This structure makes possible designing a layout of electrodes more freely.

In the organic semiconductor device according to the aspect of the present invention, preferably, the first electrode, the looped second electrode, and the looped conductive guiding member (i) share the gate insulation film as a forming base, and (ii) are same in height.

This structure allows the drain electrode, the source electrode, and a conductive guiding electrode to be formed in the same process.

In the organic semiconductor device according to the aspect of the present invention, preferably, the first electrode, the looped second electrode, and the looped conductive guiding member are made of a same material.

This structure allows the drain electrode, the source electrode, and a conductive guiding electrode to be formed in the same process.

The organic semiconductor device according to the aspect of the present invention preferably includes: an extracting wire which is formed above the substrate and in a same layer in which the gate electrode is formed; and a contact portion which is formed below the first electrode and in the gate insulation film, wherein, preferably, the first electrode is electrically connected to the extracting wire via the contact portion.

This structure makes possible electrically connecting the extracting wire formed in the same layer as the gate electrode is with the first electrode formed above the gate insulation film.

A method of manufacturing an organic semiconductor device according to another aspect of the present invention includes: preparing a substrate; forming a gate electrode above the substrate; forming a gate insulation film on the gate electrode; forming a metal film above the gate insulation film; forming, out of the metal film, a first electrode, a second electrode, and a conductive guiding member by predetermined patterning, the first electrode representing one of a source electrode and a drain electrode, the second electrode representing another one of the source electrode and the drain electrode and being shaped in a loop, and the conductive guiding member surrounding an outer periphery of the second electrode and being shaped in a loop; forming an organic semiconductor layer by applying a material of the organic semiconductor layer to a region surrounded by the looped second electrode so as to cover the first electrode, the looped second electrode defining an outer periphery of the organic semiconductor layer; and forming a protective film by applying a predetermined material to a region surrounded by the looped conductive guiding member so as to cover the organic semiconductor layer, the looped conductive guiding member defining an outer periphery of the protective film.

Since this method allows the conductive guiding member to define the material of the protective film, the method eliminates the need for forming an extra constituent feature, such as a bank, only for forming the protective film. Moreover, this method allows the source electrode to define the organic semiconductor layer. Thus, the method eliminates the need for forming an extra constituent feature, such as a bank, only for forming the organic semiconductor layer.

In addition, this method involves forming the source electrode defining the organic semiconductor layer and the conductive guiding member defining the protective film in the same process in which the drain electrode is formed. Accordingly, this method eliminates the need for having an extra process, other than the process for forming either the drain electrode or the source electrode, only for forming the conductive guiding member.

The method of manufacturing the organic semiconductor device according to the other aspect of the present invention preferably includes forming an interlayer insulation film on the protective film.

The method makes possible manufacturing an organic semiconductor device which allows (i) the protective film to prevent the organic semiconductor layer from characteristically degrading, and (ii) the interlayer insulation film to prevent an interlayer current leakage.

In the method of manufacturing the organic semiconductor device according to the other aspect of the present invention, preferably, the forming the gate electrode includes: forming an extracting wire for the first electrode above the substrate, and the forming the gate insulation film involves forming a contact hole in the gate insulation film, the contact hole connecting the first electrode and the extracting wire.

This method makes possible electrically connecting the extracting wire formed above the substrate and the first electrode formed above the gate insulation film.

In the method of manufacturing the organic semiconductor device according to the other aspect of the present invention, preferably, the forming the organic semiconductor layer involves applying the material of the organic semiconductor layer by an inkjet technique.

This method makes possible easily forming the organic semiconductor layer by the inkjet technique.

In the method of manufacturing the organic semiconductor device according to the other aspect of the present invention, preferably, the forming the protective film involves applying the predetermined material by an inkjet technique.

This method makes possible easily forming the protective film by the inkjet technique.

An organic semiconductor device according to another aspect of the present invention includes: a first organic semiconductor device which is the organic semiconductor device according to the organic semiconductor in the aspect of the present invention; and a second organic semiconductor device, wherein the second organic semiconductor device includes: a second gate electrode which is formed above a substrate included in the first organic semiconductor device; a second gate insulation film which is formed on the second gate electrode; a third electrode which is formed above the second gate insulation film and works as one of a second source electrode and a second drain electrode; a fourth electrode which (i) is formed above the second gate insulation film and shaped in a loop so as to surround the third electrode, and (ii) works an other one of the second source electrode and the second drain electrode; a second organic semiconductor layer which is formed above the second gate insulation film and applied to a region surrounded by the looped fourth electrode so as to cover the third electrode, the looped fourth electrode defining an outer periphery of the second organic semiconductor layer; a second conductive guiding member which is shaped in a loop and formed above the second gate insulation film outside the looped fourth electrode; and a second protective film which (i) is applied to a region surrounded by the second looped conductive guiding member so as to cover the second organic semiconductor layer, and (ii) protects the second organic semiconductor layer, the looped second conductive guiding member defining an outer periphery of the second protective film, and the second looped conductive guiding member included in the second organic semiconductor device has a voltage applied, the voltage being as great in electric potential as a voltage applied to a conductive guiding member shaped in a loop included in the first organic semiconductor device.

This structure prevents a potential difference from occurring between the first conductive guiding member of the first organic semiconductor device and the second conductive guiding member of the second organic semiconductor device. Accordingly, the structure prevents a possible electric field from occurring between the first conductive guiding member of the first organic semiconductor device and the second conductive guiding member of the second organic semiconductor device. Thus, the prevention of the electric field can curb the increase of the off-current caused by the interaction occurring between the neighboring organic semiconductor devices.

(On a thin-film transistor according to an aspect of the present invention)

Figure 13A:
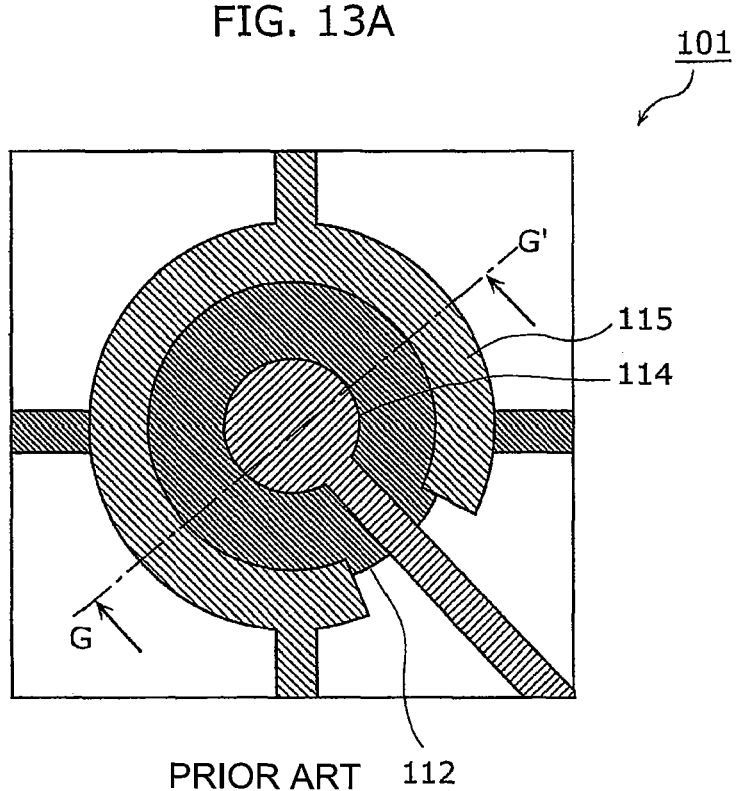
FIG. 13A is a plan view of the conventional organic thin-film transistor having a drain electrode, a source electrode, and a gate electrode.
Figure 13B:
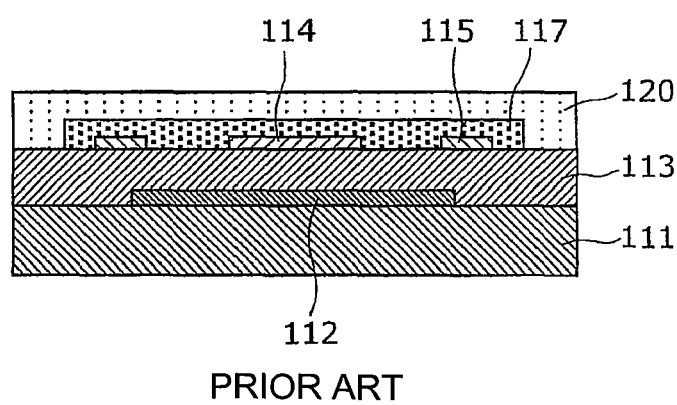
FIG. 13B is a cross-sectional view of the conventional organic thin-film transistor taken from line G-G' of FIG. 13A.

Regarding the above-described conventional organic thin-film transistor 101 shown in FIGS. 13A and 13B, the passivation film 120 is not suitable enough as a protective film dedicated to the organic semiconductor layer 117. Hence, the conventional organic thin-film transistor 101 has a problem in that the organic semiconductor layer 117 suffers deterioration, resulting in variation in the threshold voltage "Vt".

This is because the passivation film 120 of the conventional organic thin-film transistor 101 appears to merely serve as an interlayer insulation film. In other words, the passivation film 120 of the conventional organic thin-film transistor 101 is only capable of preventing an interlayer current leakage.

Thus, the inventors of the present invention devoted deep studies to a structure which prevents an organic semiconductor layer from deteriorating. Details of the studies are described below.

Figure 14:
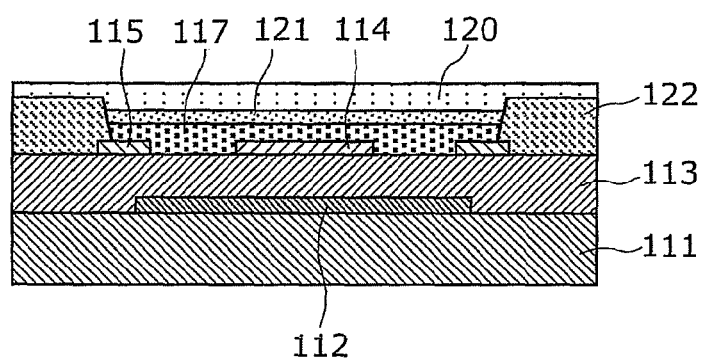
FIG. 14 is a cross-sectional view of an organic thin-film transistor improved on the conventional organic thin-film transistor.

First, the inventors considered forming a protective film primarily intended to protect an organic semiconductor layer aside from a passivation film. In order to form a protective film 121 as well as the organic semiconductor layer 117 in a desired region, as shown in FIG. 14, the inventors tried to form a bank 122 so as to surround the source electrode 115 outside, and form the organic semiconductor layer 117 and the protective film 121 inside the bank 122.

This technique, however, may be problematic at the present time since, based on current technologies, the technique may require extra expenses and processes for forming the bank 122 which lead to increasing costs. Nonetheless, it is anticipated that future advances may reduce the extra expenses and processes and alleviate such problems.

As a result of further studies, the inventors of the present invention conceived an idea of an organic semiconductor device according to an implementation of the present invention described below.

Described hereinafter is the organic semiconductor device according to an implementation of the present invention and a manufacturing method thereof based on Embodiments.

(Embodiment 1)

Figure 1B:
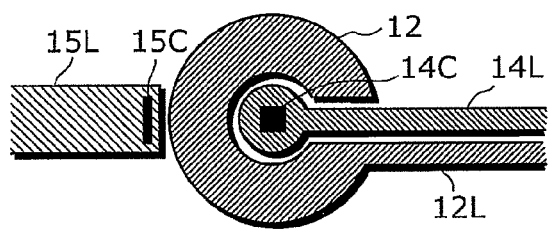
FIG. 1B is a plan view of the organic semiconductor device according to Embodiment 1 of the present invention, the organic semiconductor device which has a gate electrode, a drain wire, and a source wire.
Figure 1C:
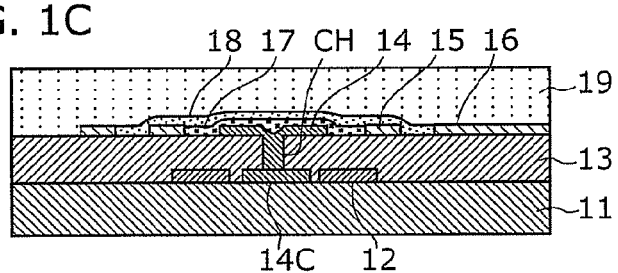
FIG. 1C is a cross-sectional view, of the organic semiconductor device according to Embodiment 1 of the present invention, taken from line B-B' of FIG. 1A.
Figure 1D:
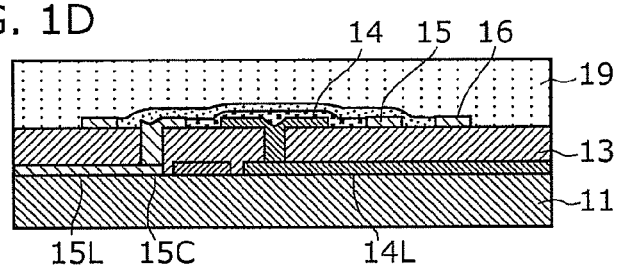
FIG. 1D is a cross-sectional view, of the organic semiconductor device according to Embodiment 1 of the present invention, taken from line A-A' of FIG. 1A.

First, described hereinafter is an organic semiconductor device according to Embodiment 1 of the present invention with reference to FIGS. 1A to 1D. FIG. 1A is a plan view of an organic semiconductor device according to Embodiment 1 of the present invention, the organic semiconductor device which has a source electrode, a drain electrode, and a conductive guiding member. FIG. 1B is a plan view of the organic semiconductor device according to Embodiment 1 of the present invention, the organic semiconductor device which has a gate electrode, a source wire, and a drain wire. FIG. 1C is a cross-sectional view, of the organic semiconductor device according to Embodiment 1 of the present invention, taken from line B-B' of FIG. 1A. FIG. 1D is a cross-sectional view, of the organic semiconductor device according to Embodiment 1 of the present invention, taken from line A-A' of FIG. 1A.

As shown in FIG. 1C, an organic semiconductor device 1 according to Embodiment 1 of the present invention includes the following: a substrate 11, a gate electrode 12, a gate insulation film 13, a drain electrode 14, a source electrode 15, a conductive guiding member 16, an organic semiconductor layer 17, and a protective film 18. It is noted that a glass substrate is used as the substrate 11 in Embodiment 1; concurrently, the substrate 11 shall not be limited to glass. For example, the substrate 11 may be a flexible substrate made of a plastic film.

The gate electrode 12 is formed above the substrate 11 as shown in FIGS. 1C and 1D. As shown in FIG. 1B, the gate electrode 12 is shaped in a ring-like loop with a part thereof cutout in a planar view. Connected to the gate electrode 12 is a gate wire 12L. The gate wire 12L is an extracting wire used for applying a predetermined gate voltage to the gate electrode 12. The gate electrode 12 and the gate wire 12L may be made of, for example, one of the followings: (i) an alloy including molybdenum (Mo) and tungsten (W), (ii) Mo, (iii) aluminum (Al), (IV) an alloy including Al and copper (Cu), and (V) Cu.

As shown in FIG. 1B, formed inside the gate electrode 12 is a drain contact portion 14C provided at an end of a drain wire 14L. The drain wire 14L is formed so as to extend from the drain contact portion 14C outward the gate electrode 12. Here, the drain wire 14L is an extracting wire used for applying a predetermined drain voltage to the drain electrode 14. In the present invention, the drain wire 14L and the gate electrode 12 are formed in the same layer so that the source electrode 15 provided above the gate insulation film 13 is formed in an unbroken single loop. In other words, since the source electrode 15 surrounds the drain electrode 14, the drain electrode 14 and the drain wire 14L need to be provided in different layers. Otherwise, the source electrode should be broken for connecting the drain electrode and the drain wire as shown in the conventional organic semiconductor transistor in FIG. 13A.

In addition, a source contact portion 15C is formed opposite the drain contact portion 14C in relation to the gate electrode 12. A source wire 15L is formed so as to extend from the source contact portion 15C. The source wire 15L is an extracting wire used for applying a predetermined source voltage to the source electrode 15.

It is noted that, as shown in FIGS. 1C and 1D, the drain wire 14L and the source wire 15L are provided in the same layer as the gate electrode 12 is. The drain wire 14L and the source wire 15L are also made of the same material as the gate electrode 12 is.

As shown in FIGS. 1C and 1D, the gate insulation film 13 is formed over the substrate 11 to cover the gate electrode 12, the drain wire 14L, and the source wire 15L. The gate insulation film 13 can be formed out of one of (i) a silicon oxide film, (ii) a silicon nitride film, and (iii) an organic insulation film including a film having a silicon oxide film and a silicon nitride film stacked. It is noted that the gate insulation film 13 is formed out of an organic insulation film made of polyimide, polyvinylphenol, and polypropylene.

As shown in FIGS. 1C and 1D, formed above the gate insulation film 13 are the drain electrode 14, the source electrode 15, and the conductive guiding member 16.

FIGS. 1A and 1C show that the drain electrode 14; namely a first electrode of the present invention, is in a ring-like shape greater than the drain contact portion 14C in diameter. As shown in FIG. 1C, the drain electrode 14 is formed so as to overlap an inner periphery portion of the gate electrode 12 via the gate insulation film 13. As shown in FIGS. 1C and 1D, furthermore, the drain electrode 14 and the drain contact portion 14C are electrically connected via a contact portion of a contact hole CH formed in the gate insulation film 13.

FIGS. 1A and 1C show that the source electrode 15; namely a second electrode of the present invention, is shaped in an unbroken single ring-like loop centered coincident with the center of the drain electrode 14. The source electrode 15 is formed so as to surround the drain electrode 14. The source electrode 15 and the drain electrode 14 are formed with distance maintained constant. As shown in FIGS. 1A and 1C, moreover, the source electrode 15 is formed so as to overlap an outer periphery portion of the gate electrode 12 via the gate insulation film 13. As shown in FIG. 1D, the source electrode 15 and the source contact portion 15C are electrically connected via the contact portion of a contact hole CH formed in the gate insulation film 13.

It is noted that the drain electrode 14 and the source electrode 15 can be made of, for example, Mo, W, gold (Au), and silver (Ag).

As shown in FIG. 1A, the conductive guiding member 16 is a guide electrode shaped in an unbroken single ring-like loop, and formed to surround the source electrode 15. The conductive guiding member 16 and the source electrode 15 are formed with a certain distance maintained. Connected to the conductive guiding member 16 is a guide wire 16L used for applying a predetermined voltage to the conductive guiding member 16. As shown in FIGS. 1C and 1D, the conductive guiding member 16 is provided in the same layer as the drain electrode 14 and the source electrode 15 are, and made of the same material as the drain electrode 14 and the source electrode 15 are.

The drain electrode 14, the source electrode 15, and the conductive guiding member 16 are concentrically formed.

As shown in FIGS. 1C and 1D, an organic semiconductor layer 17 is above the gate insulation film 13 and between the drain electrode 14 and the source electrode 15. The organic semiconductor layer 17 is formed in a region surrounded by the source electrode 15 so as to cover the drain electrode 14 on top. Specifically, the organic semiconductor layer 17 is applied and formed in the region surrounded by the source electrode 15 so as to cover the drain electrode 14. Here, the source electrode 15 defines the outer periphery of the organic semiconductor layer 17.

As a material of the organic semiconductor layer 17, the following soluble organic materials may be used: pentacene, a phthalocyanine-based material, and a porphyrin-based material.

As shown in FIGS. 1C and 1D, formed over the organic semiconductor layer 17 is a protective film 18 in order to protect the organic semiconductor layer 17. The protective film 18 is formed in a region other than a region where the organic semiconductor layer 17 is formed. In the region surrounded by the conductive guiding member 16, the protective film 18 is formed so as to cover the organic semiconductor layer 17. In other words, the protective film 18 is applied and formed in the region surrounded by the conductive guiding member 16 over the organic semiconductor layer 17. The conductive guiding member 16 defines the outer periphery of the protective film 18.

Preferably, the protective film 18 includes a photoinitiator crosslinking material. When a photoinitiator crosslinking material is exposed to light, molecular binding is observed in molecules therein. This makes the molecular structure of the molecules denser, and the polymer binding more solid. The solid polymer binding can effectively block water, oxygen, and impurities which would otherwise enter the organic semiconductor layer 17. The photoinitiator crosslinking material includes a high polymer material such as acrylic polymer and a low polymer material such as acrylic monomer. For example, the photoinitiator crosslinking material to be used here is a material which is a mixture of acrylic polymer and acrylic monomer added with IR-907 made by Ciba-Geigy Ltd. as a photopolymerization initiator and diethylthioxanthone as a hydrogen extracting material. Application of ultraviolet light, having a center wavelength of 365 nm or 405 nm, to the resulting material forms an organic protective film having a denser molecular structure. Furthermore, the protective film 18 preferably includes a thermal crosslinking material in addition to a photoinitiator crosslinking material.

It is noted that the protective film 18 shall not consist only of the organic material; instead, a material such as the above-described organic with an inorganic material, including silicon, added may also be used. Compared with an organic protective film which consists only of an organic material, the use of the material such as an organic material with an inorganic material added, including silicon, can further prevent water and oxygen from entering As shown in FIGS. 1C and 1D, an interlayer insulation film 19 is formed so as to cover the protective film 18, the conductive guiding member 16, and the exposing gate insulation film 13. The interlayer insulation film 19 planarizes the surface of the organic semiconductor device as well as reduces an interlayer current leakage. The interlayer insulation film 19 is formed of Spin On Glass (SOG).

Forming the interlayer insulation film 19 as described above can achieve the following: (i) the protective film 18 serves a first function which prevents the organic semiconductor layer 17 from characteristically degrading; and (ii) the interlayer insulation film 19 serves a second function which exercises interlayer insulation. Hence, forming the two films allows the first function and the second function to be functionally separated. Accordingly, the functional separation makes possible preventing (i) the organic semiconductor layer 17 from characteristically degrading, as well as (ii) an interlayer current leakage. This structure can make the organic semiconductor device 1 reliable.

Described next is an effect of the organic semiconductor device 1 according to Embodiment 1 of the present invention structured above.

Figure 2:
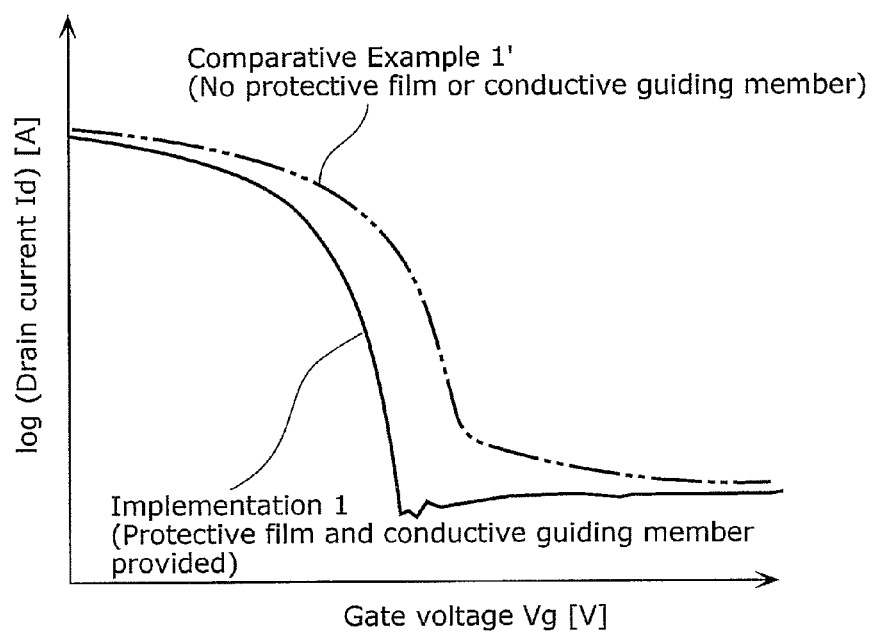
FIG. 2 shows respective relationships, between a gate voltage and a drain current, observed in (i) the organic semiconductor device according to Embodiment 1 of the present invention and (ii) an organic semiconductor device according to a comparative example.
Figure 3A:
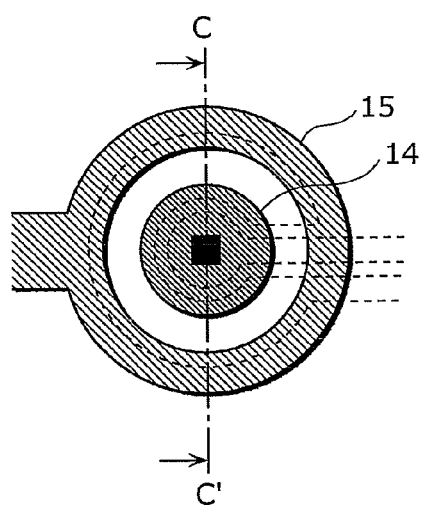
FIG. 3A is a plan view of the organic semiconductor device according to the comparative example, the organic semiconductor which has a drain electrode and a source electrode.
Figure 3B:
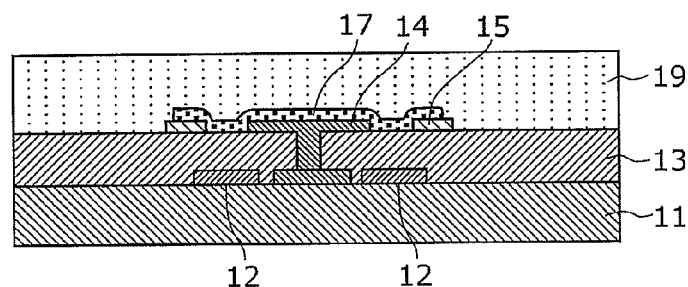
FIG. 3B is a cross-sectional view, of the organic semiconductor device according to the comparative example, taken from line C-C' of FIG. 3A.

FIG. 2 shows respective relationships (transfer characteristics), between a gate voltage and a drain current, observed in (i) the organic semiconductor device 1 (hereinafter referred to as "Implementation 1") according to Embodiment 1 of the present invention, and (ii) an organic semiconductor device 1' (hereinafter referred to as "Comparative Example 1'") according to a comparative example. In FIG. 2, a curve in a solid line shows the relationship, between the gate voltage and the drain current, observed in the Implementation 1. A curve in a broken line shows the relationship, between the gate voltage and the drain current, observed in Comparative Example 1'. Here, the organic semiconductor device 1' according to the comparative example has a structure as shown in FIGS. 3A and 3B. Compared with the organic semiconductor device 1 according to Embodiment 1 of the present invention shown in FIGS. 1A and 1C, the organic semiconductor device 1' does not have the protective film 18 or the conductive guiding member 16 formed. It is noted that FIG. 3B is a cross-sectional view taken from line C-C' of FIG. 3A. The Comparative Example 1' and Implementation 1 shown in FIGS. 1A and 1C share the same numerical references in identical constituent features.

In FIG. 2A, a comparison between Implementation 1 and Comparative Example 1' shows that a threshold voltage "Vt" observed in transfer characteristics of Implementation 1 is smaller than a threshold voltage "Vt" observed in transfer characteristics of Comparative Example 1'. This is because comparative Example 1' has the interlayer insulation film 19 directly formed on the organic semiconductor layer 17. When the interlayer insulation film 19 is formed on the organic semiconductor layer 17, water and oxygen in the air and impurities possibly enter the organic semiconductor layer 17 or an interface found between the gate insulation film 13 and the drain electrode 14 (or source electrode 15). Here, the impurities (i) are solvents included in the interlayer insulation film 19 itself, and (ii) possibly act as carriers against the organic semiconductor layer 17.

Hence, the water, the oxygen, and the impurities entering the organic semiconductor layer 17 and the interface affect the transfer characteristics, which causes a shift of the threshold voltage "Vt" and a drop of a drain current "Id". In contrast, Implementation 1 keeps the organic semiconductor layer 17 from directly covering the interlayer insulation film 19; instead, Implementation 1 has the protective film 18 formed in order to protect the organic semiconductor layer 17. This structure can inhibit water, oxygen, and impurities from entering the organic semiconductor layer 17 and the interface, and prevent the organic semiconductor layer 17 from deteriorating. Thus, Implementation 1 successfully reduces variations of the threshold voltage "Vt".

In addition, Implementation 1 causes the conductive guiding member 16 to define the outer periphery of the protective film 18. Thus, a certain region surrounded by the conductive guiding member 16 is secured as the region where the protective film 18 is to be applied. This structure makes possible mainly protecting the organic semiconductor layer 17, and preventing the protective film 18 from interfering with interlayer wiring connection.

Furthermore, the organic semiconductor device 1 according to Embodiment 1 has the source electrode 15 and the conductive guiding member 16 centered with respect to the drain electrode 14 and formed in unbroken single ring-liker loops. In other words, these electrodes are concentrically formed. This structure makes possible maintaining distance constant between the electrodes to provide equal electric fields as well as equal electrical field distributions.

In addition, the concentrically formed electrodes allow a solution including an organic semiconductor material or an over-coating agent to spread concentrically when the solution is dropped in the middle of the concentric circles. This structure allows the organic semiconductor layer 17 and the protective film 18 to be formed with significant uniformity without uneven film-thickness.

The organic semiconductor device 1 according to Embodiment 1 of the present invention shows the effect below when two or more of the organic semiconductor devices 1 are arranged.

Figure 4:
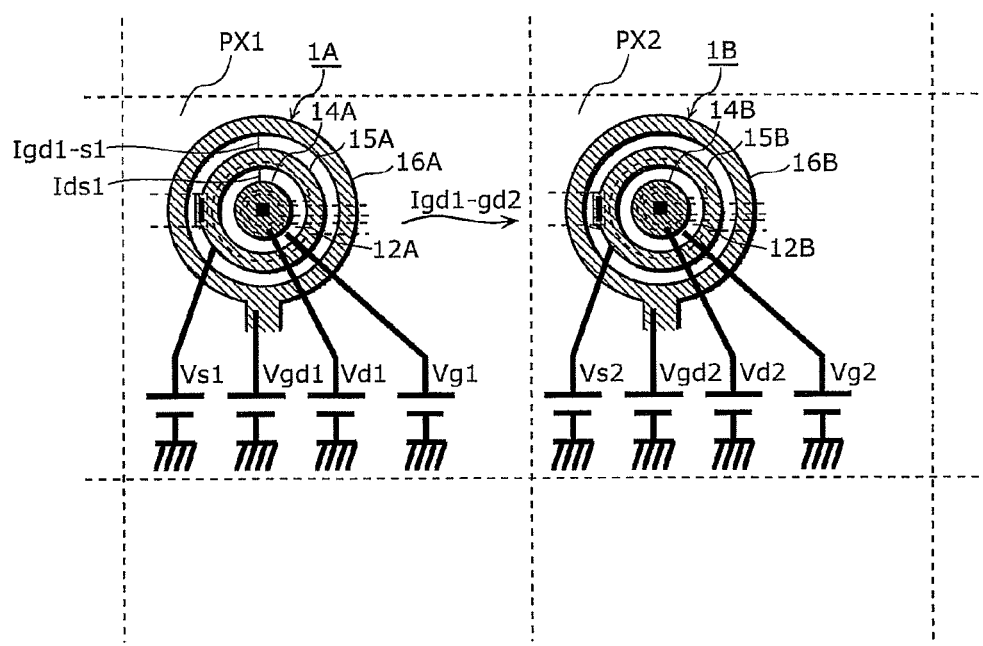
FIG. 4 is a schematic view of two pixels in an active-matrix display device.

Assumed here is an active-matrix display device including an organic semiconductor array device having two or more of the organic semiconductor devices 1 according to Embodiment 1 of the present invention arranged. FIG. 4 is a schematic view of two pixels in the active-matrix display device.

As shown in FIG. 4, a first pixel "PX1" and a second pixel "PX2" respectively have a first organic semiconductor device 1A a second organic semiconductor device 1B provided. Sharing the same structure, the first organic semiconductor device 1A and the second organic semiconductor device 1B are equivalent to the organic semiconductor device 1 according to Embodiment 1 of the present invention illustrated in FIGS. 1A to 1D. It is noted in each pixel that FIG. 4 does not show a constituent feature other than the organic semiconductor device. The other constituent features are omitted, accordingly.

As shown in FIG. 4, the first organic semiconductor device 1A has the following voltages to be applied: a gate voltage "Vg1" to be applied to a first gate electrode 12A; a drain voltage "Vd1" to a first drain electrode 14A; a source voltage "Vs1" to a first source electrode 15A; and a guide voltage "Vgd1" to a first conductive guiding member 16A. The second organic semiconductor device 1B has the following voltages to be applied: a gate voltage "Vg2" to a second gate electrode 12B; a drain voltage "Vd2" to a second drain electrode 14B; a source voltage "Vs2" to a second source electrode 15B; and a guide voltage "Vgd2" to a second conductive guiding member 16B.

When the predetermined gate voltage "Vg1" is applied and the first organic semiconductor device 1A is activated, the first organic semiconductor device 1A can obtain drain current "$I_{ds1}$".

Here, the first organic semiconductor device 1A preferably controls the guide voltage "Vgd1" and the source voltage "Vs1" to hold Vgd1=Vs1. This control prevents a potential difference from occurring between the first source electrode 15A and the first conductive guiding member 16A. Hence, occurrence of a current; namely $I_{gd1\text{-}s1}$, is curbed between the first source electrode 15A and the first conductive guiding member 16A. Accordingly, this structure can inhibit an interaction occurring between the first organic semiconductor device 1A and a neighboring organic semiconductor device (the second organic semiconductor device 1B, for example) from increasing an off-current.

When two or more of the organic semiconductor devices 1" according to the comparative example shown in FIGS. 3A and 3B are used as TFTs, an operation of each TFT causes a micro potential difference. Such a micro potential difference generates a micro surface current to flow between the neighboring TFTs, and deteriorates off-current characteristics. In particular, the micro potential difference prevents an organic EL display from securing a modulated current (on-off ratio). As a result, displaying a black color suffers the effect, and the displayed black turns out to be a pale black. In contrast, when two or more of the organic semiconductor devices 1 according to Embodiment 1 of the present invention are used as the TFTs, the TFTs control the guide voltage and the source voltage to hold Vgd1=Vs1. This control makes possible reducing a micro surface current occurring between the TFTs to reduce an increase of the off-current. It is noted here that Vgd1=Vs1=0 is preferably held. The above structure can nearly prevent an effect caused by the interaction occurring between the organic semiconductor devices.

Moreover, the guide voltages "Vgd1" and "Vgd2" of the first organic semiconductor device 1A and the second organic semiconductor device 1B are preferably controlled to hold Vgd1=Vgd2. This control causes no potential difference between the first conductive guiding member 16A included in the first organic semiconductor device 1A and the second organic semiconductor device 1B included in the second conductive guiding member 16B. Accordingly, generation of a current; namely $I_{gd1\text{-}gd2}$, is reduced. Thus, the reduction can curb the increase of the off-current caused by the interaction occurring between the neighboring organic semiconductor devices.

Described next is a manufacturing method of the organic semiconductor device according to Embodiment 1 of the present invention, with reference to FIGS. 5A to 5J. FIGS. 5A to 5J are cross-sectional views of the organic semiconductor device in each process of the manufacturing method according to Embodiment 1.

Figure 5A:
FIG. 5A shows a process of Step S101 in a manufacturing method of the organic semiconductor device according to Embodiment 1 of the present invention.

First, a predetermined substrate; namely the substrate 11, is prepared as shown in FIG. 5A (S101). In Embodiment 1, the substrate 11 is a glass substrate. Then, formed on the substrate is an undercoat layer made of SiN (not shown) through the Plasma Chemical Vapor Deposition (CVD). The undercoat layer is a film to prevent impurities from diffusing out of the glass substrate or the glass component.

Figure 5B:
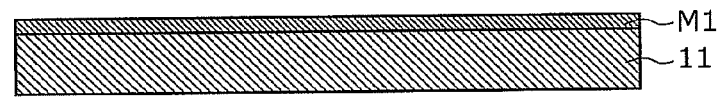
FIG. 5B shows a process of Step S102 in the manufacturing method of the organic semiconductor device according to Embodiment 1 of the present invention.

Next, as shown in FIG. 5B, provided above the substrate 11 is a first metal film M1 to be formed into the gate electrode 12, the drain wire 14L, and the drain wire 15L (S102). The first metal film M1 is deposited through one of the sputtering, the evaporation, and the Plasma CVD. The first metal film M1 is made of Mo, W, Cu, and Al, as described above.

Figure 5C:
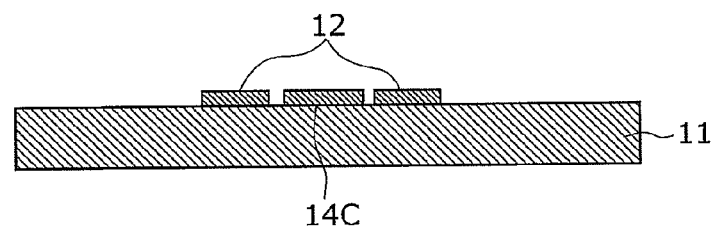
FIG. 5C shows a process of Step S103 in the manufacturing method of the organic semiconductor device according to Embodiment 1 of the present invention.

Then, as shown in FIG. 5C, the first metal film M1 is patterned by etching. Hence, the gate electrode 12, the drain wire 14L, and the source wire 15L are simultaneously formed in predetermined shapes, as shown in FIG. 1B. Here, a region on which the first metal film M1 is etched has the substrate 11 exposed. It is noted that FIG. 5C shows only the gate electrode 12 and the drain contact portion 14C provided at an end of the drain wire 14L.

As described above, the gate electrode 12, the drain wire 14L, and the source wire 15L are formed out of the single first metal film M1 by simultaneous patterning. Thus, the gate electrode 12, the drain wire 14L, and the source wire 15L are the same in height.

Figure 5D:
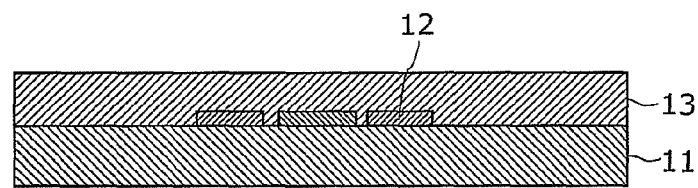
FIG. 5D shows a process of Step S104 in the manufacturing method of the organic semiconductor device according to Embodiment 1 of the present invention.

Next, as shown in FIG. 5D, the gate insulation film 13 is formed on the gate electrode 12 (S104). Deposited through the Plasma CVD or a deposition technique depending on a material, the gate insulation film 13 is formed entirely over the substrate 11. For example, the gate insulation film 13 is (i) made of an inorganic insulation film, such as a silicon oxide film or a silicon nitride film, and (ii) deposited through the Plasma CVD. The gate insulation film 13 is also formed out of an organic insulation film made of polyimide, polyvinylphenol, and polypropylene. It is noted that in the case where the substrate 11 is a resin-based flexible substrate, the spin coat technique is employed to deposit the gate insulation film 13.

Figure 5E:
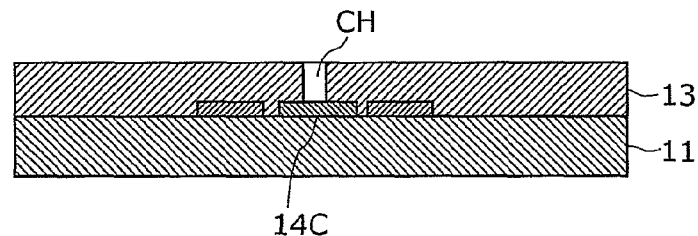
FIG. 5E shows a process of Step S105 in the manufacturing method of the organic semiconductor device according to Embodiment 1 of the present invention.

Then, as shown in FIG. 5E, the contact hole CH is formed in a part of the gate insulation film 13 positioned on the drain contact portion 14C included in the drain wire 14L (S105). In the case where the gate insulation film 13 includes a photosensitizing agent and is formed through a deposition technique, for example, the contact hole CH can be formed by patterning through the photolithographic technique. In the case where the gate insulation film 13 does not include a photosensitizing agent and is formed through the Plasma CVD, the contact hole CH can be formed out of a pattern-formed resist to be dry-etched or wet-etched.

Figure 5F:
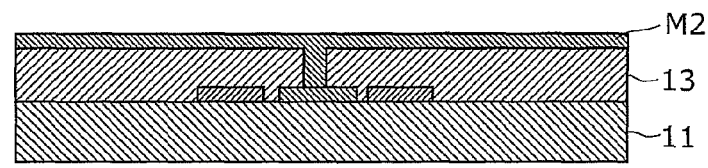
FIG. 5F shows a process of Step S106 in the manufacturing method of the organic semiconductor device according to Embodiment 1 of the present invention.

Next, as shown in FIG. 5F, a second metal film M2 is formed above the entire surface of the gate insulation film 13 so as to fill the contact hole CH (S106). The second metal film M2 is formed into the drain electrode 14, the source electrode 15, and the conductive guiding member 16. Here, the second metal film M2 is filled into the contact hole CH to form the contact portion. The second metal film M2 is made of Mo, W, Au and Ag, as described above.

Figure 5G:
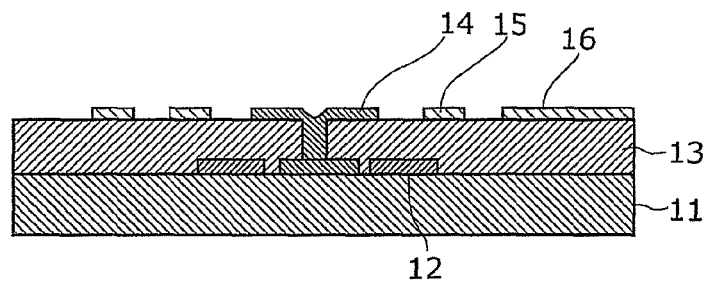
FIG. 5G shows a process of Step S107 in the manufacturing method of the organic semiconductor device according to Embodiment 1 of the present invention.

Then, as shown in FIG. 5G, the second metal film M2 is patterned by etching. Hence, the drain electrode 14, the source electrode 15, and the conductive guiding member 16 are simultaneously formed in predetermined shapes, as shown in FIG. 1A (S107). Here, a region on which the first metal film M1 is removed has the gate insulation film 13 exposed. As described above, the drain electrode 14, the source electrode 15, and the conductive guiding member 16 are formed out of the single second metal film M2 by simultaneous patterning. Thus, the drain electrode 14, the source electrode 15, and the conductive guiding member 16 are the same in height.

Figure 5H:
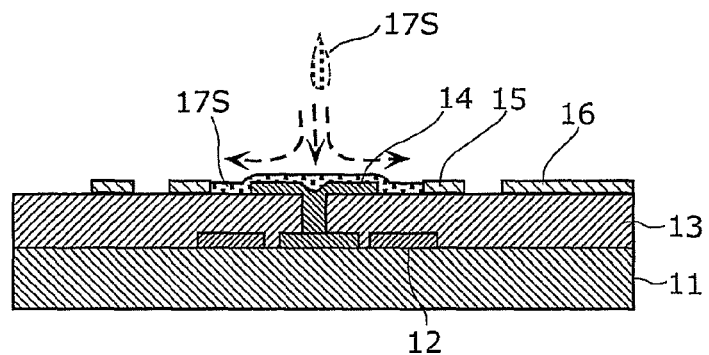
FIG. 5H shows a process of Step S108 in the manufacturing method of the organic semiconductor device according to Embodiment 1 of the present invention.

Next, a preliminary treatment is provided to a boundary surface of the gate insulation film 13 and the drain electrode 14 (the source electrode 15). Then, as shown in FIG. 5H, a solution 17S including an organic semiconductor material is dropped and applied by the inkjet technique. Here, an inner wall of the looped source electrode 15 acts as a guard to define a region to which the solution 17S, including the organic semiconductor material, is applied. This structure prevents the solution 17S, including the organic semiconductor material, from flowing onto or outside the source electrode 15. Then, predetermined heat treatment is provided to dry the solution 17S including the organic semiconductor material and to crystallize the organic semiconductor material. As a result, formed is the organic semiconductor layer 17 whose outer periphery is defined by the source electrode 15.

The above the solution applied by the inkjet technique is preferably dropped near the center of the drain electrode 14. Dropped near the center, the solution 17S including the organic semiconductor material spreads with uniformity within the region surrounded by the source electrode 15 working as a stopper. As a result, formed is the organic semiconductor layer 17 with excellent uniformity. The above predetermined heat treatment is preferably provided under a temperature at which (i) the organic semiconductor material included in the solution 17S crystallizes without suffering heat decomposition, and (ii) a solvent of the solution 17S can evaporate. In Embodiment 1, the heat treatment is provided under approximately 200 degrees Celsius.

Figure 5I:
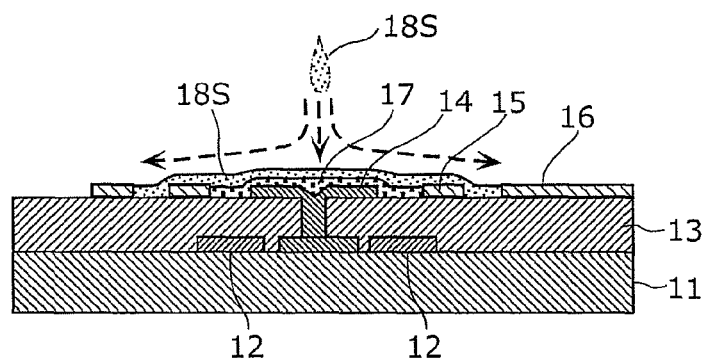
FIG. 5I shows a process of Step S109 in the manufacturing method of the organic semiconductor device according to Embodiment 1 of the present invention.

Next, as shown in FIG. 5I, dropped and applied by the inkjet technique is a solution 18S including an over-coating agent used for a material of the protective film 18 (S109). Here, an inner wall of the looped conductive guiding member 16 acts as a guard to define a region to which the solution 18S, including the over-coating agent, is applied. This structure prevents solution 18S, including the over-coating agent, from flowing onto or outside the conductive guiding member 16. Once the solution 18S including the over-coating agent is applied to a predetermined region, predetermined heat treatment is provided. This heat treatment dries the solution 18S including the over-coating agent, and forms the protective film 18 whose outer periphery is defined by the looped conductive guiding member 16.

Here, when the over-coating agent included in the solution 18S contains a thermal crosslinking material, the heat treatment makes possible improving a protecting capability of the protective film 18. When the over-coating agent contains a photoinitiator crosslinking material, extra irradiation treatment using ultra-violet light encourages molecular binding in molecules therein. This makes the molecular structure of the molecules denser, and the polymer binding more solid. The solid polymer binding can enhance a blocking capability of the protective film 18 against water, oxygen, and impurities.

The above solution 18S including the over-coating agent and applied by the inkjet technique is preferably dropped near the center of the drain electrode 14. Dropped near the center, the solution 18S including the over-coating agent spreads with uniformity within the region surrounded by the conductive guiding member 16 working as a stopper. As a result, formed is a protective film with excellent uniformity.

Figure 5J:
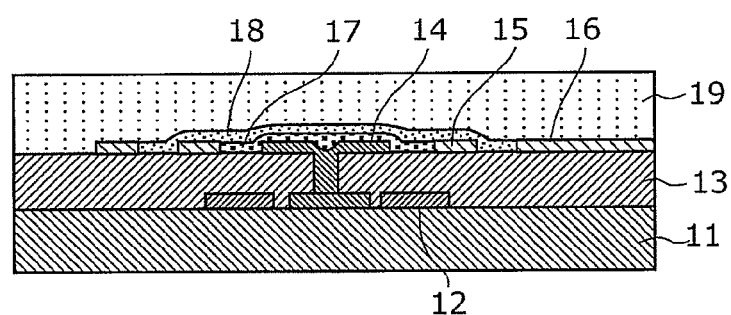
FIG. 5J shows a process of Step S110 in the manufacturing method of the organic semiconductor device according to Embodiment 1 of the present invention.

Then, as shown in FIG. 5J, the interlayer insulation film 19 is formed entirely over the substrate 11, including the protective film 18 (S110). The interlayer insulation film 19 is formed in predetermined thickness so as to planarize the surface thereof. It is noted that the interlayer insulation film 19 can be formed with a predetermined material applied, such as the SOG.

According to a manufacturing method of the organic semiconductor device 1 according to Embodiment 1 of the present invention, the conductive guiding member 16 can define a region to which the over-coating agent to be protective film 18 is applied. This method eliminates the need for forming an extra constituent feature, such as a bank, only for forming the protective film 18 within a predetermined region. In addition, the method takes advantage of the source electrode 15 in order to define the region in which the organic semiconductor layer 17 is formed. Accordingly, this method eliminates the need for forming an extra constituent feature, such as a bank, only for forming the organic semiconductor layer 17 within a predetermined region. Hence, the manufacturing method of the organic semiconductor device according to Embodiment 1 eliminates the needs of the following extra processes: forming and patterning a light-sensitive resin layer used as a bank material; and removing a resist. Thus, eliminating such processes can prevent the manufacturing process from becoming complex.

Furthermore, the manufacturing method of the organic semiconductor device 1 according to Embodiment 1 of the present invention makes possible forming both of (i) the source electrode 15 defining the organic semiconductor layer 17 and (ii) the conductive guiding member 16 defining the protective film 18 in the same process which involves forming the drain electrode 14. This process eliminates the need for having an extra process aside from a process which involves forming the drain electrode 14 or the source electrode 15 only for forming the conductive guiding member 16. Accordingly, the manufacturing method eliminates the needs of the following extra processes: forming and patterning a metal film; and removing a resist. Thus, eliminating such processes can further prevent the manufacturing process from becoming complex.

(Modification 1 of Embodiment 1)

Figure 6A:
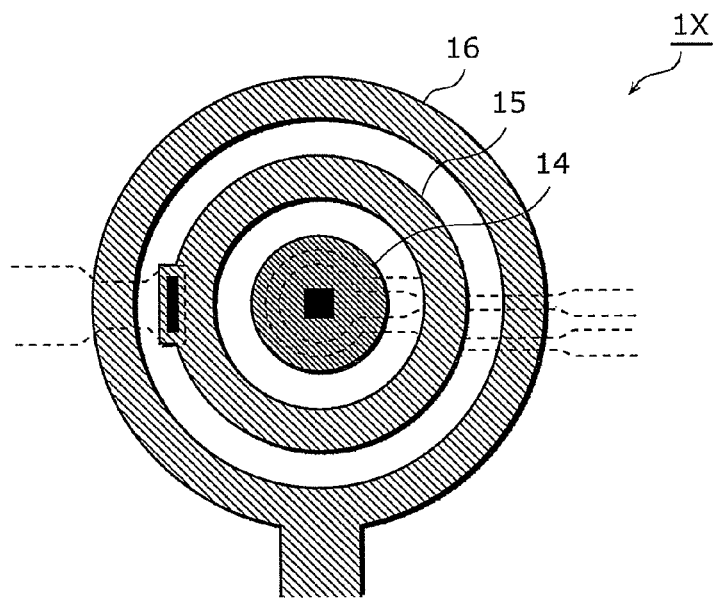
FIG. 6A is a plan view of an organic semiconductor device according to Modification 1 of Embodiment 1 of the present invention, the organic semiconductor device which has a drain electrode, a source electrode, and a conductive guiding member.
Figure 6B:
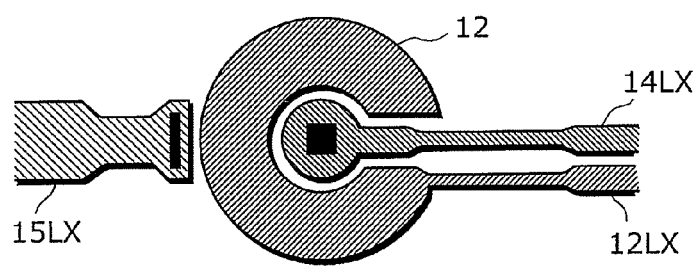
FIG. 6B is a plan view of the organic semiconductor device according to Modification 1 of Embodiment 1 of the present invention, the organic semiconductor device which has a gate electrode, a drain wire, and a source wire.

Described next is an organic semiconductor device according to Modification 1 of Embodiment 1 of the present invention with reference to FIGS. 6A and 6B. FIG. 6A is a plan view of the organic semiconductor device according to Modification 1 of Embodiment 1 of the present invention. The organic semiconductor device has a source electrode, a drain electrode, and a conductive guiding member. FIG. 6B is a plan view of the organic semiconductor device according to Modification 1 of Embodiment 1 of the present invention. The organic semiconductor device has a gate electrode, a source wire, and a drain wire. In FIGS. 6A and 6B, the constituent features identical to those in FIGS. 1A and 1B share the same numerical references. Hence the details thereof shall be omitted.

It is shapes of a gate wire 12LX, a drain wire 14LX, and a source wire 15LX as shown in FIG. 6B that an organic semiconductor device 1X according to Modification 1 of the Embodiment 1 of the present invention in FIGS. 6A and 6B differs from the organic semiconductor device 1 according to Embodiment 1 of the present invention in FIGS. 1A and 1B. The constituent features other than the above are identical to those in the organic semiconductor device 1 according to Embodiment 1 of the present invention.

As shown in FIG. 6B, the drain wire 14LX included in the organic semiconductor device 1X according to Modification 1 has a portion with narrow width. On the portion, there is a part narrower than another part in width. The narrower part has the source electrode 15 and the conductive guiding member 16 cross the narrower part, the source electrode 15, and the conductive guiding member 16 which are formed above the narrower part. This structure can reduce an interlayer capacity developed in the part where the source electrode 15 (or the conductive guiding member 16) crosses the drain wire 14LX.

Similarly, as shown in FIG. 6B, the gate wire 12LX included in the organic semiconductor device 1X according to Modification 1 has a portion with narrow width. On the portion, there is a part narrower than another part in width. The narrower part has the source electrode 15 and the conductive guiding member 16 cross the narrower part, the source electrode 15, and the conductive guiding member 16 which are formed above the narrower part. Moreover, the source wire 15LX included in the organic semiconductor device 1X according to Modification 1 has a portion with narrow width. On the portion, there is a part narrower than another part in width. The narrower part has the conductive guiding member 16 cross the narrower part, the conductive guiding member 16 which is formed above the narrower part. This structure can reduce an interlayer capacity developed in the part where each electrode crosses the wire.

(Modification 2 of Embodiment 1)

Figure 7A:
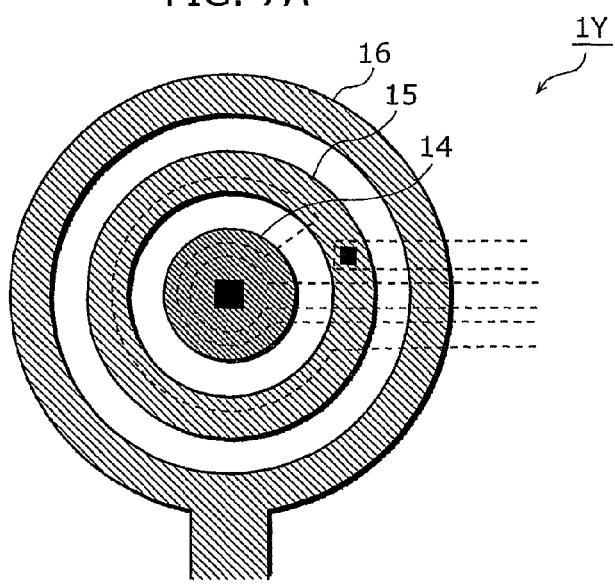
FIG. 7A is a plan view of an organic semiconductor device according to Modification 2 of Embodiment 1 of the present invention, the organic semiconductor device which has a drain electrode, a source electrode, and a conductive guiding member.
Figure 7B:
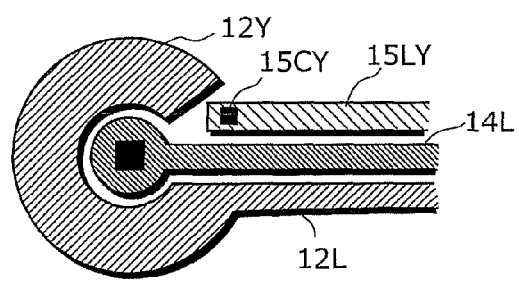
FIG. 7B is a plan view of the organic semiconductor device according to Modification 2 of Embodiment 1 of the present invention, the organic semiconductor device which has a gate electrode, a drain wire, and a source wire.

Described next is an organic semiconductor device 1Y according to Modification 2 of Embodiment 1 of the present invention with reference to FIGS. 7A and 7B. FIG. 7A is a plan view of the organic semiconductor device according to Modification 2 of Embodiment 1 of the present invention. The organic semiconductor device has a source electrode, a drain electrode, and a conductive guiding member. FIG. 7B is a plan view of the organic semiconductor device according to Modification 2 of Embodiment 1 of the present invention. The organic semiconductor device has a gate electrode, a source wire, and a drain wire. In FIGS. 7A and 7B, the constituent features identical to those in FIGS. 1A and 1B share the same numerical references. Hence the details thereof shall be omitted.

It is a forming position of an source wire 15LY and a shape of a gate electrode 12Y as shown in FIG. 7B that an organic semiconductor device 1Y according to Modification 2 of the Embodiment 1 of the present invention in FIGS. 7A and 7B differs from the organic semiconductor device 1 according to Embodiment 1 of the present invention in FIGS. 1A and 1B. The constituent features other than the above are identical to those in the organic semiconductor device according to Embodiment 1 of the present invention.

As shown in FIG. 7B, the source wire 15LY of the organic semiconductor device 1Y according to Modification 2 is formed so as to extend in the same direction as the gate wire 12L and the drain wire 14L extend. This structure allows a layout pattern of each extracting wire to be easily designed. It is noted that a tip of the source wire 15LY has a source contact portion 15CY.

In Embodiment 1, the gate electrode 12Y has a larger cutout portion. This structure makes possible increasing the distance between the gate electrode 12Y and the source wire 15LY. The increased distance can reduce an effect caused by a source voltage applied to the source wire 15LY against the gate electrode 12Y.

(Embodiment 2)

Figure 8A:
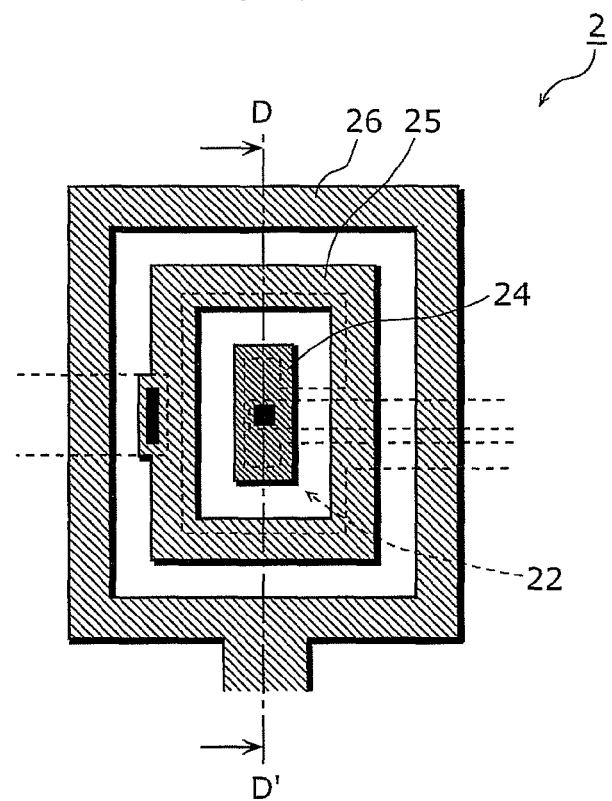
FIG. 8A is a plan view of an organic semiconductor device according to Embodiment 2 of the present invention, the organic semiconductor device which has a drain electrode, a source electrode, and a conductive guiding member.
Figure 8B:
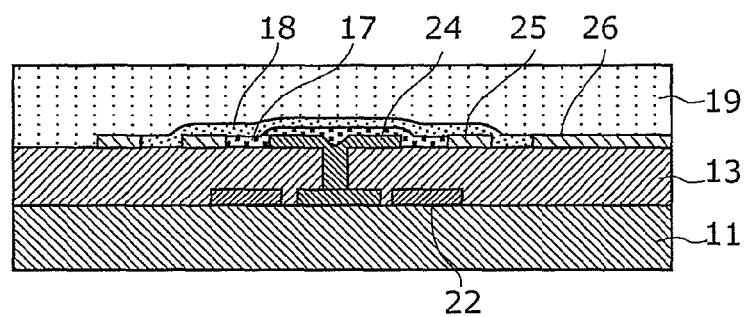
FIG. 8B is a cross-sectional view, of the organic semiconductor device according to Embodiment 2 of the present invention, taken from line D-D' of FIG. 8A.

Described next is an organic semiconductor device according to Embodiment 2 of the present invention with reference to FIGS. 8A and 8B. FIG. 8A is a plan view of the organic semiconductor device according to Embodiment 2 of the present invention. The organic semiconductor device has a source electrode, a drain electrode, and a conductive guiding member. FIG. 8B is a cross-sectional view of the organic semiconductor device according to Embodiment 2 of the present invention, taken from line D-D' of FIG. 8A. In FIGS. 8A and 8B, the constituent features identical to those in FIGS. 1A and 1C share the same numerical references. Hence the details thereof shall be omitted.

It is shapes of a drain electrode 24, a source electrode 25, a conductive guiding member 26, and a gate electrode 22 as shown in FIG. 8A that an organic semiconductor device 2 according to Embodiment 2 of the present invention in FIGS. 8A and 8B differs from the organic semiconductor device 1 according to Embodiment 1 of the present invention in FIGS. 1A and 1C. The constituent features other than the above are identical to those in the organic semiconductor device 1 according to Embodiment 1 of the present invention.

As shown in FIG. 8A, the organic semiconductor device 2 according to Embodiment 2 has the drain electrode 24 shaped in a rectangle. In addition, the source electrode 25 formed in a loop, the conductive guiding member 26 formed in a loop, and the gate electrode 22 formed in a loop are all shaped in rectangles. Here, the looped gate electrode has a part thereof cutout. Having each electrode formed in a rectangle, the structure of the organic semiconductor device 2 according to Embodiment 2 makes possible designing a layout of electrodes more freely.

The organic semiconductor device 2 according to Embodiment 2 has an effect similar to that of the organic semiconductor device 1 according to Embodiment 1 of the above described present invention.

Figure 9A:
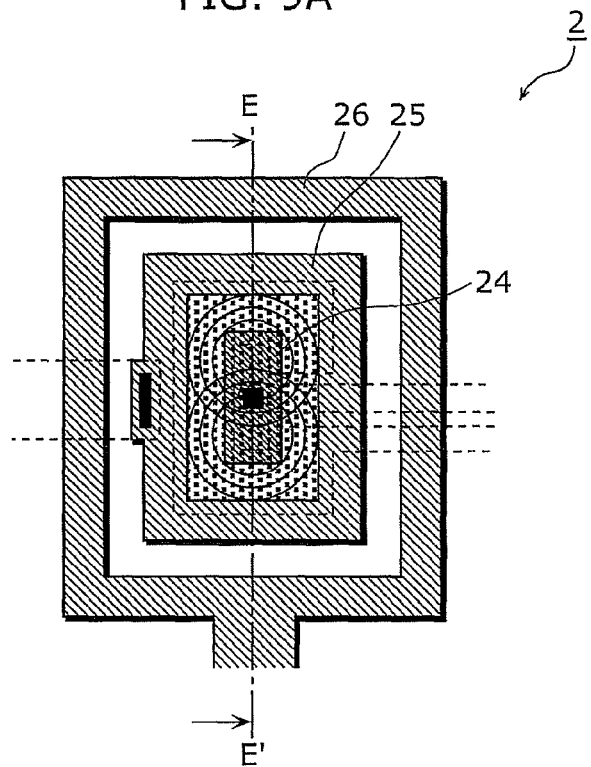
FIG. 9A is a plan view illustrating a process to apply a solution including an organic semiconductor material in a manufacturing method of the organic semiconductor device according to Embodiment 2 of the present invention.
Figure 9B:
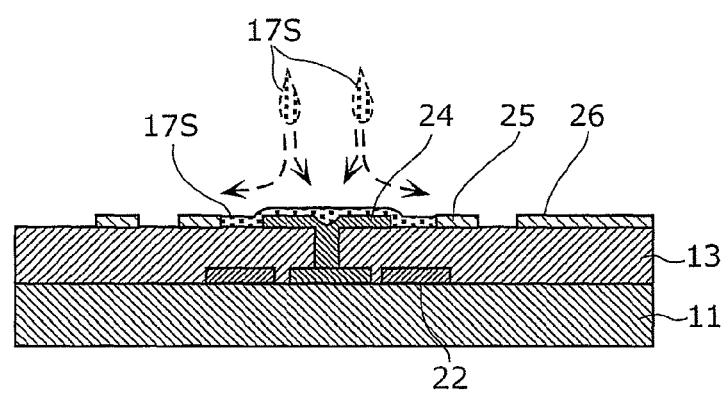
FIG. 9B is a cross-sectional view (a cross-sectional view taken from line E-E' of FIG. 9A) illustrating the process to apply the solution including the organic semiconductor material in the manufacturing method of the organic semiconductor device according to Embodiment 2 of the present invention.
Figure 10A:
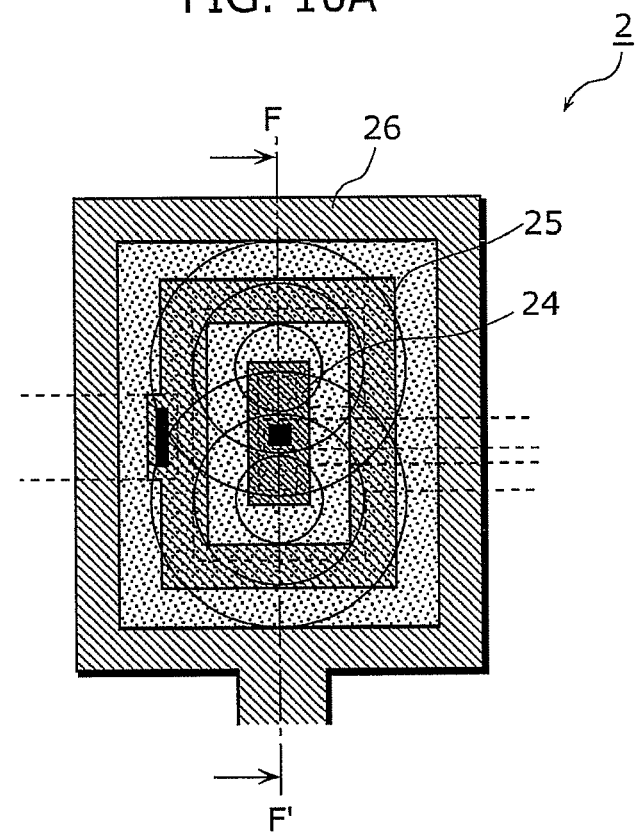
FIG. 10A is a plan view illustrating a process to apply a solution including an over-coating agent in the manufacturing method of the organic semiconductor device according to Embodiment 2 of the present invention.
Figure 10B:
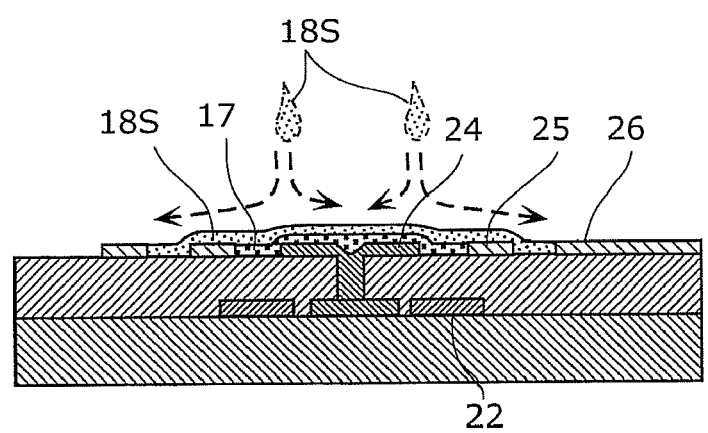
FIG. 10B is a cross-sectional view (a cross-sectional view taken from line F-F' of FIG. 10A) illustrating the process to apply the solution including the over-coating agent in the manufacturing method of the organic semiconductor device according to Embodiment 2 of the present invention.

Described next is the organic semiconductor device 2 according to Embodiment 2 of the present invention with reference to FIGS. 9A to 10B. FIG. 9A is a plan view illustrating a process to apply a solution including an organic semiconductor material in a manufacturing method of the organic semiconductor device 2 according to Embodiment 2 of the present invention. FIG. 9B is a cross-sectional view of the process. FIG. 10A is a plan view illustrating a process to apply a solution including an over-coating agent in the manufacturing method of the organic semiconductor device 2 according to Embodiment 2 of the present invention. FIG. 10B is a cross-sectional view of the process.

Basic processes in the manufacturing method of the organic semiconductor device 2 according to Embodiment 2 of the present invention are the same as those in the manufacturing method of the organic semiconductor device 1 according to Embodiment 1 of the present invention shown in FIGS. 5A to 5J.

It is processes to apply (i) a solution including an organic semiconductor material and (ii) a solution including an over-coating agent that the manufacturing method of the organic semiconductor device 2 according to Embodiment 2 of the present invention differs from that of the organic semiconductor device 1 of organic semiconductor device 1 according to Embodiment 1 of the present invention. The processes other than the above are identical to those in the organic semiconductor device 1 according to Embodiment 1 of the present invention. Thus, details thereof shall be omitted.

As shown in FIGS. 9A and 9B, the process to apply the solution including the organic semiconductor material in the manufacturing method of the organic semiconductor device 2 according to Embodiment 2 of the present invention involves applying drops of the solution 17S including the organic semiconductor material. In Embodiment 2, as shown in FIGS. 9A and 9B, two of the drops are applied. This process makes possible applying the solution 17S including the organic semiconductor material with uniformity within the region surrounded by the source electrode 25 even though the drain electrode 24 and the source electrode 25 are electrodes shaped in rectangles.

Furthermore, as shown in FIGS. 10A and 10B, the process to apply the solution including the over-coating agent in the manufacturing method of the organic semiconductor device 2 according to Embodiment 2 of the present invention involves applying drops of the solution 18S including the over-coating agent. As shown in FIGS. 10A and 10B, two of the drops are applied in Embodiment 2. This process makes possible applying the solution 18S including the over-coating agent with uniformity within the region surrounded by the conductive guiding member 26 even though the source electrode 25 and the conductive guiding member 26 are electrodes shaped in rectangles.

It is noted that the solution in each process is preferably applied closer to the center of the organic semiconductor device 2 as each electrode is formed more similar to a ring-like shape. This allows the organic semiconductor layer 17 and the protective film 18 to be formed with significantly uniformed without uneven film-thickness. In the case where the rectangular electrode is great in aspect ratio, another application technique may be employed to provide more drops to apply. Furthermore, the drops shall not be limited to be applied in a line. The solution to be applied may be appropriately adjusted to spread with uniformity within a desired application region.

Applying the solution in drops can be exercised by moving a head of a nozzle providing the solution. Embodiment 2 involves applying the solution in drops by longitudinally moving the head of the nozzle to two points. It is noted that a head having two or more nozzles in advance may be used instead of moving the head of the nozzle.

(Embodiment 3)

Described next is a display device according to Embodiment 3 of the present invention with reference to FIG. 11. The display device employs the organic semiconductor device according to Embodiments 1 and 2 as a display. An implementation of the display device according to Embodiment 3 exemplifies an application of the display device to an organic EL display.

Figure 11:
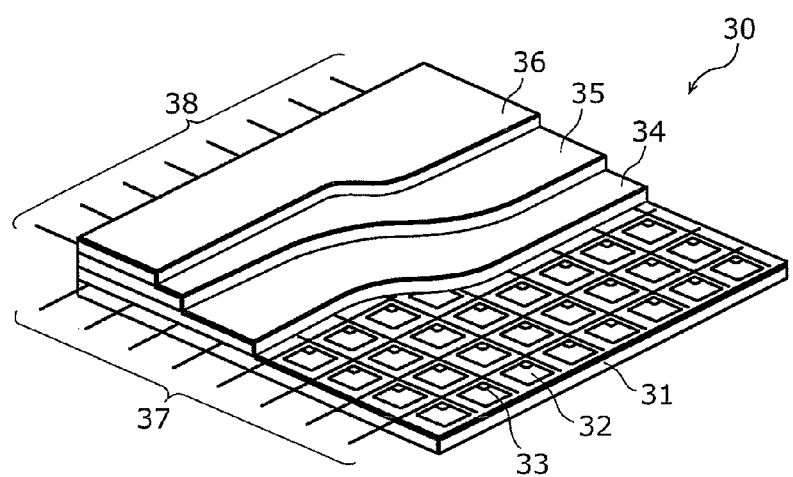
FIG. 11 is a cutout view of an organic EL display according to Embodiment 3 of the present invention.

FIG. 11 is a cutout view of the organic EL display according to Embodiment 3 of the present invention. The organic semiconductor device according to each Embodiment described above can be used with a switching element of an active-matrix substrate included in the organic EL display.

As shown in FIG. 11, an organic EL display 30 includes the following: an active-matrix substrate 31; pixels 21 arranged in a matrix on the active-matrix substrate 31; pixel circuits 33 connected to the respective pixels 32 and arranged in an array on the active-matrix substrate 31; an anode 34, an organic EL layer 35, and a cathode 36 (a clear electrode) stacked in a named order on the pixels 32 and the pixel circuits 33; and source lines 37 and gate lines 38 connecting each of the pixel circuits 33 and a control circuit (not shown). The EL layer 35 is formed to have each of an electron transport layer, a luminescent layer, and a hole transport layer stacked.

The organic EL display 30 has any given organic semiconductor device, in above-described Embodiments, provided in each pixel circuit 33 as a switching element for each pixel 32.

Figure 12:
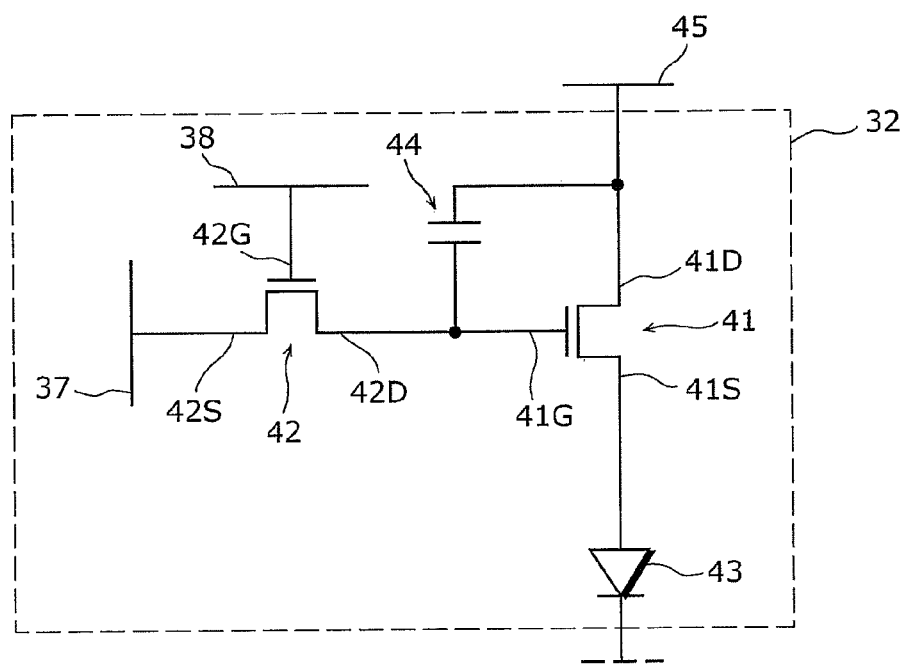
FIG. 12 is a circuit diagram of a pixel employing the organic semiconductor device according to each Embodiment of the present invention.

Described next is a circuit structure of the pixel 32 included in the above organic EL display 30 with reference to FIG. 12. FIG. 12 is a circuit diagram of a pixel employing the organic semiconductor device according to each Embodiment of the present invention.

As shown in FIG. 12, the pixel 32 includes the following: a driving organic semiconductor device 41, a selecting organic semiconductor device 42, an organic EL element 43, and a capacitor 44. The driving organic semiconductor device 41 is a driving transistor driving the organic EL element 43. The selecting organic semiconductor device 42 is a selecting transistor.

The selecting organic semiconductor 42 has: a source electrode 42S connected to a source wire 37; a gate electrode 42G connected to the gate wire 38; and a drain electrode 42D connected to a gate electrode 41G of the driving organic semiconductor device 41 and the capacitor 44.

The driving organic semiconductor device 41 has: a drain electrode 41D connected to a power supply wire 45; and a source electrode 41S connected to the anode of the organic EL element 43.

In this structure, when a gate signal is provided to the gate wire 38 to turn the selecting organic semiconductor 42 on, a signal voltage supplied via the source wire 37 is written in the capacitor 44. The hold voltage written in the capacitor 44 is to be held for one frame period. The hold voltage changes the conductance of the driving organic semiconductor device 41 in analogue, and a drive current corresponding to a light-emitting gradation flows from the anode to the cathode of the organic EL element 43. Hence, the organic EL element 43 illuminates, and an image is displayed.

It is noted that the organic semiconductor devices according to Embodiments 1 and 2 can be applied to both of the driving organic semiconductor device 41, and the selecting organic semiconductor device 42.

Described above is a display according to an embodiment of the present invention; meanwhile, the present invention shall not be limited to this. Described in Embodiment 3 is, for example, an organic EL display using an organic EL element; concurrently, the display according to Embodiment 3 can also be applied to a display including another display element, such as a liquid crystal element, using an active-matrix substrate.

In addition, the display according to Embodiment 3 of the present invention described above can be used as a flat panel display. The flat panel display is applicable to any display device including a television set, a personal computer, and a cellular phone.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

In each Embodiment, the first electrode is a drain electrode, and the looped second electrode surrounding the first electrode is a source electrode. Simultaneously, the first electrode may be the source electrode, and the second electrode formed in a loop may be and the drain electrode.

INDUSTRIAL APPLICABILITY

An organic semiconductor device according to the present invention can be widely employed for a variety of electronic appliances such as: a television set, a personal computer, a display device on a cellular phone, and a switching element.

What is claimed is:
1. An organic semiconductor device, comprising:
a substrate;
a gate electrode above the substrate;
a gate insulation film over the gate electrode;
a first electrode above the gate insulation film, the first electrode being one of a source electrode and a drain electrode;

a second electrode above the gate insulation film, the second electrode being annular and surrounding the first electrode, the second electrode being an other of the source electrode and the drain electrode;

an organic semiconductor layer above the gate insulation film and over the first electrode, the second electrode surrounding the organic semiconductor layer and defining an outer periphery of the organic semiconductor layer;

a conductive guiding member above the gate insulation film, the conductive guiding member being annular and surrounding the second electrode; and a protective film above the gate insulation film and over the organic semiconductor layer and the second electrode, the conductive guiding member surrounding the protective film and defining an outer periphery of the protective film.

2. The organic semiconductor device according to claim 1, further comprising:
an interlayer insulation film above the protective film.

3. The organic semiconductor device according to claim 1, wherein the second electrode is the source electrode, and
a first voltage is applied to the conductive guiding member, a second voltage is applied to the source electrode, and an electric potential of the first voltage is at least equal to an electric potential of the second voltage.

4. The organic semiconductor device according to claim 3, wherein the first voltage and the second voltage are zero volts.

5. The organic semiconductor device according to claim 1, wherein the protective film comprises a high polymer material and a low polymer material that are photoinitiator crosslinking.

6. The organic semiconductor device according to claim 1, wherein the protective film comprises a high polymer material and a low polymer material that are photoinitiator crosslinking and thermal crosslinking.

7. The organic semiconductor device according to claim 1, wherein the second electrode and the first electrode are concentric, and the second electrode is completely annular.

8. The organic semiconductor device according to claim 1, wherein the second electrode is a circular annulus.

9. The organic semiconductor device according to claim 1, wherein the looped conductive guiding member is a circular annulus.

10. The organic semiconductor device according to claim 1, wherein the second electrode is a rectangular annulus.

11. The organic semiconductor device according to claim 1, wherein the looped conductive guiding member is a rectangular annulus.

12. The organic semiconductor device according to claim 1,
wherein each of the first electrode, the second electrode, and the conductive guiding member are disposed on the gate insulation film, and
a height of the first electrode, a height of the second electrode, and a height of the conductive guiding member are equal.

13. The organic semiconductor device according to claim 1, wherein a material of the first electrode, a material of the second electrode, and a material of the conductive guiding member are the same.

14. The organic semiconductor device according to claim 1, further comprising:
an extracting wire above the substrate in a layer that is the same as a layer of the gate electrode; and
a contact below the first electrode and in the gate insulation film,
wherein the first electrode is electrically connected to the extracting wire via the contact.

15. An organic semiconductor array device, comprising:
a first organic semiconductor being the organic semiconductor device according to claim 1; and
a second organic semiconductor, including:
a second gate electrode above a second substrate included in the first organic semiconductor device;
a second gate insulation film over the second gate electrode;
a third electrode above the second gate insulation film, the third electrode being one of a second source electrode and a second drain electrode;
a fourth electrode above the second gate insulation film, the fourth electrode being annular and surrounding the third electrode, the fourth electrode being an other of the second source electrode and the second drain electrode
a second organic semiconductor layer above the second gate insulation film and over the third electrode, the fourth electrode surrounding the second organic semiconductor layer and defining an outer periphery of the second organic semiconductor layer;
a second conductive guiding member above the second gate insulation film, the second conductive guiding member being annular and surrounding the fourth electrode; and
a second protective film above the second gate insulation film and over the second organic semiconductor layer and the fourth electrode, the second conductive guiding member surrounding the second protective film and defining an outer periphery of the second protective film,
wherein a first voltage is applied to the second conductive guiding member of the second organic semiconductor, a second voltage is applied to the conductive guiding member of the first organic semiconductor, and an electric potential of the first voltage is at least equal to an electric potential of the second voltage.

16. A method of manufacturing an organic semiconductor device, comprising:
preparing a substrate;
forming a gate electrode above the substrate;
forming a gate insulation film over the gate electrode;
forming a metal film above the gate insulation film;
forming, out of the metal film, a first electrode, a second electrode, and a conductive guiding member by predetermined patterning, the first electrode being one of a source electrode and a drain electrode, the second electrode being an other of the source electrode and the drain electrode and being annular and surrounding the first electrode, the conductive guiding member being annular and surrounding the second electrode;
forming an organic semiconductor layer above the gate insulation film and over the first electrode by applying a first material within a region surrounded by the second electrode, the second electrode defining an outer periphery of the organic semiconductor layer; and
forming a protective film above the gate insulation film and over the organic semiconductor layer and the second electrode by applying a second material within a region surrounded by the conductive guiding member, the conductive guiding member defining an outer periphery of the protective film.

17. The method of manufacturing the organic semiconductor device according to claim 16, further comprising:

forming an interlayer insulation film above the protective film.

18. The method of manufacturing the organic semiconductor device according to claim 16, further comprising:

forming an extracting wire for the first electrode above the substrate when forming the gate electrode; and forming a contact in the gate insulation film that connects the first electrode and the extracting wire.

19. The method of manufacturing the organic semiconductor device according to claim 16, wherein the organic semiconductor layer is formed by applying the first material via an inkjet technique.

20. The method of manufacturing the organic semiconductor device according to claim 16, wherein the protective film is formed by applying the second material via an inkjet technique.

* * * * *